United States Patent [19]
Lee et al.

[11] Patent Number: 6,057,676
[45] Date of Patent: May 2, 2000

[54] REGULATED DRAM CELL PLATE AND PRECHARGE VOLTAGE GENERATOR

[75] Inventors: Ki-Jun Lee; Gurpreet Bhullar, both of Nepean; Michael B. Vladescu, Carp, all of Canada

[73] Assignee: Mosaid Technologies Incorporated, Kanata, Canada

[21] Appl. No.: 09/099,464

[22] Filed: Jun. 18, 1998

[30] Foreign Application Priority Data

Apr. 30, 1998 [CA] Canada ................................... 2236336

[51] Int. Cl.⁷ ....................................................... G05F 3/16
[52] U.S. Cl. ............................................................. 323/316
[58] Field of Search ................................... 323/316, 315, 323/280, 281

[56] References Cited

U.S. PATENT DOCUMENTS 5,187,429  2/1993  Phillips ................................ 323/314
5,255,232  10/1993  Foss et al. .............................. 365/203
5,734,603  3/1998  Tai ........................................ 365/206

*Primary Examiner*—Shawn Riley
*Attorney, Agent, or Firm*—Kevin Pillay; Santosh K. Chari; John R. S. Orange

[57] ABSTRACT

A regulator circuit is provided for use with cell plate voltage generators of memory cell capacitors and precharge bit lines voltage generators in semiconductor memories. The circuit employs a current source coupled to the charging reference voltage whose output is controlled by a level detector, which receives as input a reference level signal and the cell plate voltage. When the cell plate voltage drops below the reference level, the level detector triggers the current source, thereby recovering the cell plate voltage to the reference level. The level detector can be disabled through an input.

13 Claims, 5 Drawing Sheets

REGULATED DRAM CELL PLATE AND PRECHARGE VOLTAGE GENERATOR

This invention relates to semiconductor memories, and in particular, to a method and apparatus for charging cell plates of memory cell capacitors and bit line precharge capacitors of a dynamic random access memory (DRAM).

BACKGROUND OF THE INVENTION

DRAMS having folded lines are well known, and typically are formed of rows or word lines and columns or bit lines, the columns each being formed of a complementary pair of the bit lines. Storage capacitors are located at the intersection of each word line and bit line, which store charge indicative of zeroes and ones. For example, the presence of a charge on a capacitor can signify the existence of a logic one. The capacitors are connected to the bit lines through access transistors, which are enabled from the word lines. Each complementary pair of bit lines is in turn connected through transistors to corresponding data bus lines.

In order to speed up reading and writing of the memory, the bit lines are pre-charged to a voltage $V_{BLP}$ which is half of the supply voltage $V_{DD}$ and the reference plate of the storage capacitor is charged to a voltage $V_{CP}$ which is half of the supply voltage $V_{DD}$. Pre-charging the bit lines to half the supply voltage reduces signal swing on the bit lines, which reduces peak current and allows faster reading.

Various circuits have been implemented to generate the storage capacitor reference voltage $V_{CP}$ and the bit line pre-charge voltage $V_{BLP}$. A low impedance drive is required for $V_{BLP}$ to maintain the bit line pre-charge level, while a high impedance drive is required for $V_{CP}$ to prevent voltage supply noise from charging the storage capacitor reference level and inadvertently enabling the access transistor and causing a corrupt read operation. A typical circuit is described in U.S. Pat. No. 5,255,232 to Foss et. al. and incorporated herein by reference.

Recently, the DRAM market has increased demands for memories with higher storage capacity and low power consumption. Higher storage capacity requires a larger number of storage capacitors which in turn requires an associated increase in the current supply drive capabilities of the cell plate and bit line precharge voltage generators. This may be achieved by increasing the size of the drive transistors supplying $V_{CP}$ and $V_{BLP}$ in order to supply sufficient current to compensate for the increased load on $V_{BLP}$ or the gate biases of the drive transistors could be adjusted in order to increase their current supply capability. A disadvantage of both techniques is the resulting increased standby current, while a disadvantage of the second technique is that it cannot be applied to a single transistor.

Furthermore, any of these changes should be capable of being implemented without an increased set-up time during power-up. It would also be advantageous to stabilize $V_{BLP}$ and $V_{CP}$ level during the access transistor on state and to minimize the stand by current for the $V_{BLP}$ and $V_{CP}$ circuit.

SUMMARY OF THE INVENTION

This invention thus seeks to provide a circuit with improved current supply capabilities, a stabilized voltage supply and an improved set-up and recovery time, for use in semiconductor memories.

In accordance with the invention, there is provided a regulator circuit for use with a voltage drive circuit for charging a memory cell bit storage capacitor reference plate to a voltage $V_{CP}$ of a semiconductor memory, said regulator circuit comprising a level detector having first and second input terminals for receiving a reference voltage and said cell plate reference voltage $V_{CP}$ respectively thereon and for producing a control signal at an output thereof in response to a relative level of said cell plate reference voltage with respect to said reference voltage; and a current source coupled to said cell plate reference voltage terminal and having a control input responsive to said output from said level detector for turning said current source on or off in response thereto, whereby when said cell plate voltage $V_{CP}$ drops below said reference voltage said current source is turned on to stabilize a said cell plate voltage supply.

In accordance with a further embodiment of the invention, the level detector is provided with a disable input terminal for receiving a disable signal.

BRIEF DESCRIPTION OF THE DRAWINGS

These and other features of the preferred embodiments of the invention will become more apparent in the following detailed description in which reference is made to the appended drawings wherein.

DETAILED DESCRIPTION OF A PREFERRED EMBODIMENT OF THE INVENTION

Figure 1:
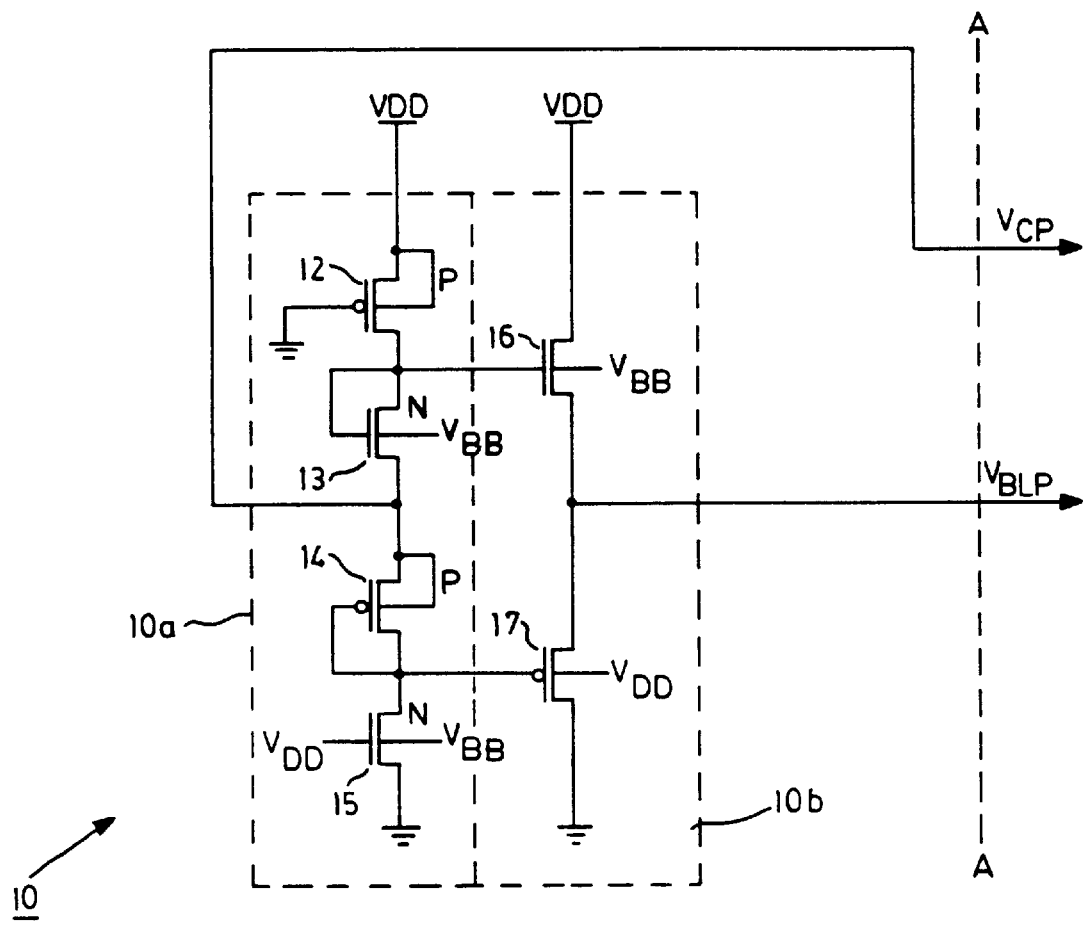
FIG. 1 is a schematic diagram of a conventional DRAM cell plate and precharge voltage generator.

In the following description like numerals refer to like elements in the drawings. Referring to FIG. 1, by way of background, a conventional voltage supply circuit for providing a cell plate voltage $V_{CP}$ and a bit line precharge voltage $V_{BLP}$ is shown generally by 10. The circuit 10 is comprised of a voltage divider 10a and a unity gain amplifier 10b. The voltage divider is comprised of a PMOS transistor 12 having its source connected to supply voltage rail VDD and its drain connected in series with the drain of an NMOS transistor 13. The source of NMOS transistor 13 is connected in series with the source terminal of PMOS transistor 14 which has its drain connected in series with the drain of NMOS 15. The gates of the NMOS transistor 13 and the PMOS transistor 14 are connected to their respective drains, while the gate of the PMOS transistor 12 is connected to ground and the gate of the NMOS transistor 15 is connected to supply VDD. Generally, the substrate of transistors 13 and 15 are connected to a source of voltage VBB and the substrates of transistors 12 and 14 are connected to their respective sources.

An NMOS transistor 16 having its source connected to the source of a PMOS transistor 17 forms the unity gain voltage amplifier. The drain of the NMOS transistor 16 is connected to the VDD and the drain of the PMOS transistor 17 is connected to ground.

In operation, the transistors 12, 13, 14 and 15 form a voltage divider between the supply voltage VDD and ground. The junction of the sources of transistors 13 and 14 thus forms a voltage divider tap at one half the supply of voltage VDD level. That voltage forms a high impedance drive for charging the bit storage capacitor reference plate (not shown) via line $V_{CP}$. The transistors 16 and 17 which are connected in series between VDD and ground, form a unity gain low output impedance voltage dividing amplifier driven from the voltages at the junction of transistors 12 and 13 and 14 and 15 respectively. As a result, one half VDD level is applied from the sources via lead $V_{BLP}$ to the bit lines.

Since $V_{BLP}$ and $V_{CP}$ are both derived from the same voltage divider, the bit line precharge and the storage capacitor reference plate voltages always track with respect to long term variations in supply voltage VDD. As memory densities increase however, in order to reduce standby current, the gate-source bias voltages of transistors 16 and 17 are adjusted to be around their respective threshold voltages by sizing transistors 12, 13, 14, 15 accordingly. As a result, during power-up, as $V_{BLP}$ is increased toward its target level, the current supply capabilities of transistors 16 and 17 are drastically reduced and the set-up time for $V_{BLP}$ on power-up is therefore too slow in comparison with other circuits.

Figure 2:
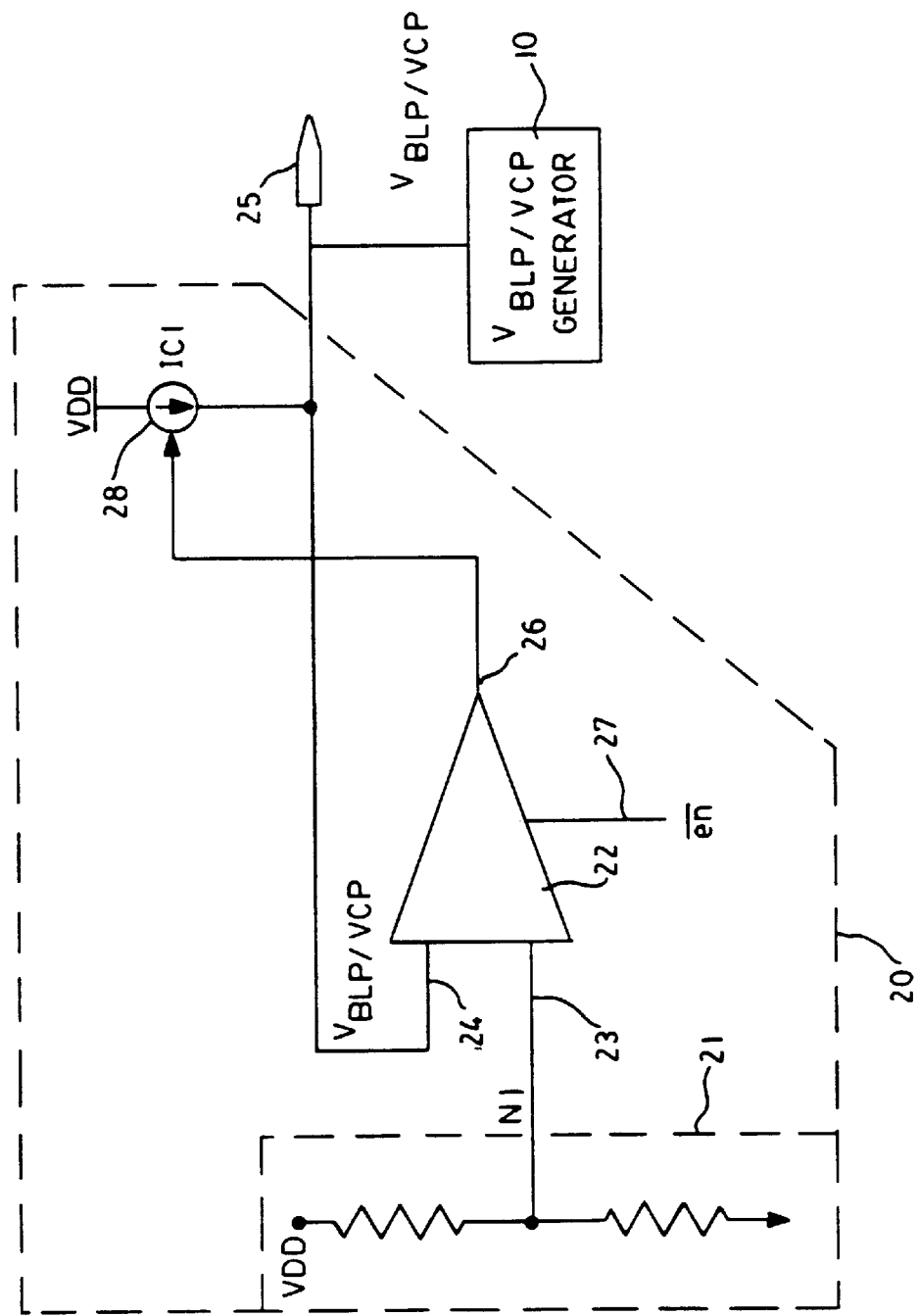
FIG. 2 is a schematic diagram of regulator circuit according to an embodiment of the present invention.

Referring now to FIG. 2, a schematic diagram of a circuit for regulating a $V_{CP}/V_{BLP}$ voltage provided by the circuit 10, according to an embodiment of the present invention is shown generally by numeral 20. The circuit consists of three functional components namely a level detector, a current supply and a comparator enable/disable circuit. The level detector 22 comprises a comparator having a first input terminal 23 connected to a $V_{BLP}/V_{CP}$ reference level signal N1, and a second input terminal 24 connected to the $V_{BLP}/V_{CP}$ signal node 25 and an output terminal 26 producing a regulator control signal which is coupled to control a current source 28. The current source 28 is connected between the supply voltage Vdd and the $V_{BLP}/V_{CP}$ node 25 to provide a current supply to the cell plate reference voltage $V_{BLP}/V_{CP}$ lines when enabled by the output 26 of the comparator 22. The comparator also includes an disable signal input 29 for disabling the comparator which in turn disables the current supply 28, thus allowing the $V_{BLP}/V_{CP}$ circuit 10 to operate as described with respect to FIG. 1. The $V_{BLP}/V_{CP}$ reference level signal N1 is set by voltage divider circuit 21.

The operation of the circuit may be explained in general terms as follows: When the cell plate voltage ($V_{CP}$) drops below the reference level, the level detector triggers the current source, thereby recovering $V_{CP}$ to the reference level. The level detector can be disabled through the disable signal input 29 to reduce current consumption after a fast power up has been achieved.

Figure 3A:
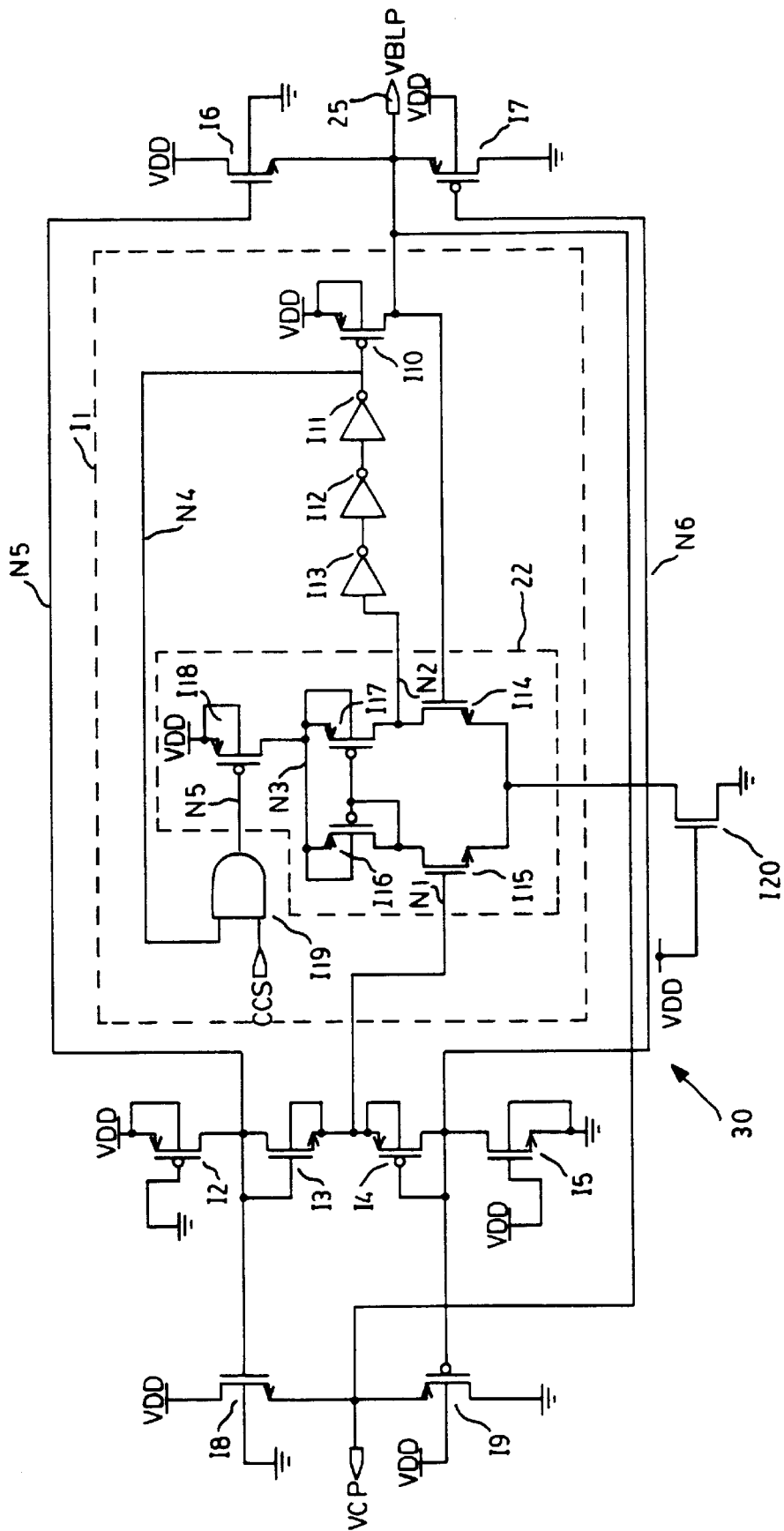
FIG. 3(a) is a detailed schematic diagram of the regulator circuit shown in FIG. 2.

Turning now to FIG. 3(a), a detailed implementation of the circuit 20 shown in FIG. 2 is indicated by numeral 30. Firstly, the level detector 22 is comprised of transistors I14, I15, I16, and I17. The input terminals 23 and 24 are comprised of the gates of respective NMOS transistors I15 and I14 having their respective drains connected to the drains of respective PMOS transistors I16 and I17. The sources of transistors I15 and I14 are connected to ground via the source-drain circuit of NMOS transistor I20. The PMOS transistors I16 and I17 have their gates connected together and in turn connected to the drain of transistor I15, while the sources are connected at a node N3 to the supply voltage VDD via the source-drain circuit of a PMOS transistor I18. The output terminal for the level detector is derived at a node N2 at the junction of transistor I17 and I14.

Secondly, the current supply 28 is comprised of three inverters I13, I12, I11 and I10 with the former three transistors connected in series, the first I13 of which has its input connected to the output N2. The output from the inverter I11 is connected to drive the gate terminal of a PMOS transistor I10. The drain terminal of the transistor I10 is connected to the $V_{BLP}$ line, while its source and substrate is connected to the supply Vdd.

Thirdly, the comparator disable circuit for generating the disable signal 29 is comprised of an AND gate I19 having its output connected to the gate of transistor I18 and one of its input terminals fed back from the output of the inverter I11. The other of the inputs of the AND gate I19 is derived from a comparator control signal CCS, generated in a manner to be described below.

Fourthly, the voltage divider 21 for setting the reference level signal N1 is comprised of transistors I2, I3, I4 and I5. The PMOS transistor I2 has its source connected to supply voltage rail VDD and its drain connected in series with the drain of the NMOS transistor I3. The source of NMOS transistor I3 is connected in series with the source terminal of PMOS transistor I4 which in turn has its drain connected in series with the drain of NMOS transistor I5. The gates of the NMOS transistor I3 and the PMOS transistor I4 are connected to their respective drains, while the gate of the PMOS transistor I2 is connected to ground and the gate of the NMOS transistor I5 is connected to the supply VDD. The substrate of transistors I2 is connected to VDD and the substrate of I5 is connected to ground, while the substrate of transistors I3 and I4 are connected to there respective sources. The junction of transistors I3 and I4 is connected to the input terminal 23 of the level detector at node N1 to provide the reference level voltage.

In operation, there are three main parts to the regulator circuit. Components I14, I15, I16, and I17 form a $V_{BLP}$ and $V_{CP}$ level detector, which is the same as a comparator. Input node N1 can be set to a desired level of $V_{BLP}/V_{CP}$ by adjusting the ratio of the I2, I3, I4, and I5 devices. If voltage $V_{BLP}/V_{CP}$ at the gate of transistor I14 is lower than the voltage at node N1, the output node N2 of the comparator is driven high through I17 and I18. If the voltage $V_{BLP}/V_{CP}$ is higher than the reference voltage at node N1, the output node N2 is driven low through transistor I14.

The devices I10, I11, I12, and I13 form the current supply device 28, which is the second component of the regulator circuit. When the output N2 of the comparator is high, the node N4 is set to low. This drives the gate of the PMOS transistor I10 low, thereby turning I10 on to provide a current source from Vdd to the $V_{BLP}/V_{CP}$ line 25. When the output N2 of the comparator is low, N4 is set to high by inverter I11, thus driving the gate of I10 high and turning I10 off.

The third component is the comparator disable device that consists of I18 and I19 (AND gate). If the comparator control signal CCS is low, then the output of the AND gate I19 is low and transistor I18 is thus turned on and the node N3 is thus set to high and the comparator is enabled. If CCS is high and $V_{BLP}$ and $V_{CP}$ reach their reference level as set at N1, N4 goes to high due to the output N2 of the comparator, then I18 turns off and the comparator is disabled. That is, if CCS is low, PMOS I10 is turned on regardless of the change in the $V_{BLP}$ and $V_{CP}$ level, for example, during a power-up conditions. On the other hand, if CCS is high the comparator is enabled and via PMOS I10 according to the change in $V_{BLP}/V_{CP}$ level. For example, with CCS high, if N4 is low, PMOS I10 is still on and the feedback ensures that PMOS I18 is also on. With N4 high on the other hand, the comparator is disabled since PMOS I18 is switched off.

The CCS signal can be derived from any signal in the semiconductor device that affects the $V_{BCP}$ and $V_{CP}$ levels. For example, a signal VBBOK indicating the status of the substrate bias voltage, $V_{BB}$ can be used. The voltage $V_{BB}$ is derived from an on-chip generated negative voltage supply which is used to prevent forward biasing of n-type devices in a p-substrate. During power-up, $V_{BB}$ is pumped to a negative target value, and the $V_{BLP}$ and $V_{CP}$ generator should therefore also be powering-up to their target value since capacitive coupling between $V_{BB}$ and $V_{CP}/V_{BLP}$ is in effect. Once $V_{BB}$ has attained its target values indicated by VBBOK being high, the $V_{BLP}/V_{CP}$ generator can operate by monitoring its value and no longer needs to be forced on. The VBBOK signal can therefore be applied to the CCS lead to achieve this desired operation.

Other signals such as PowerUpOK, or VDDinternalOK can similarly be used for CCS with the same effect.

Figure 3B:
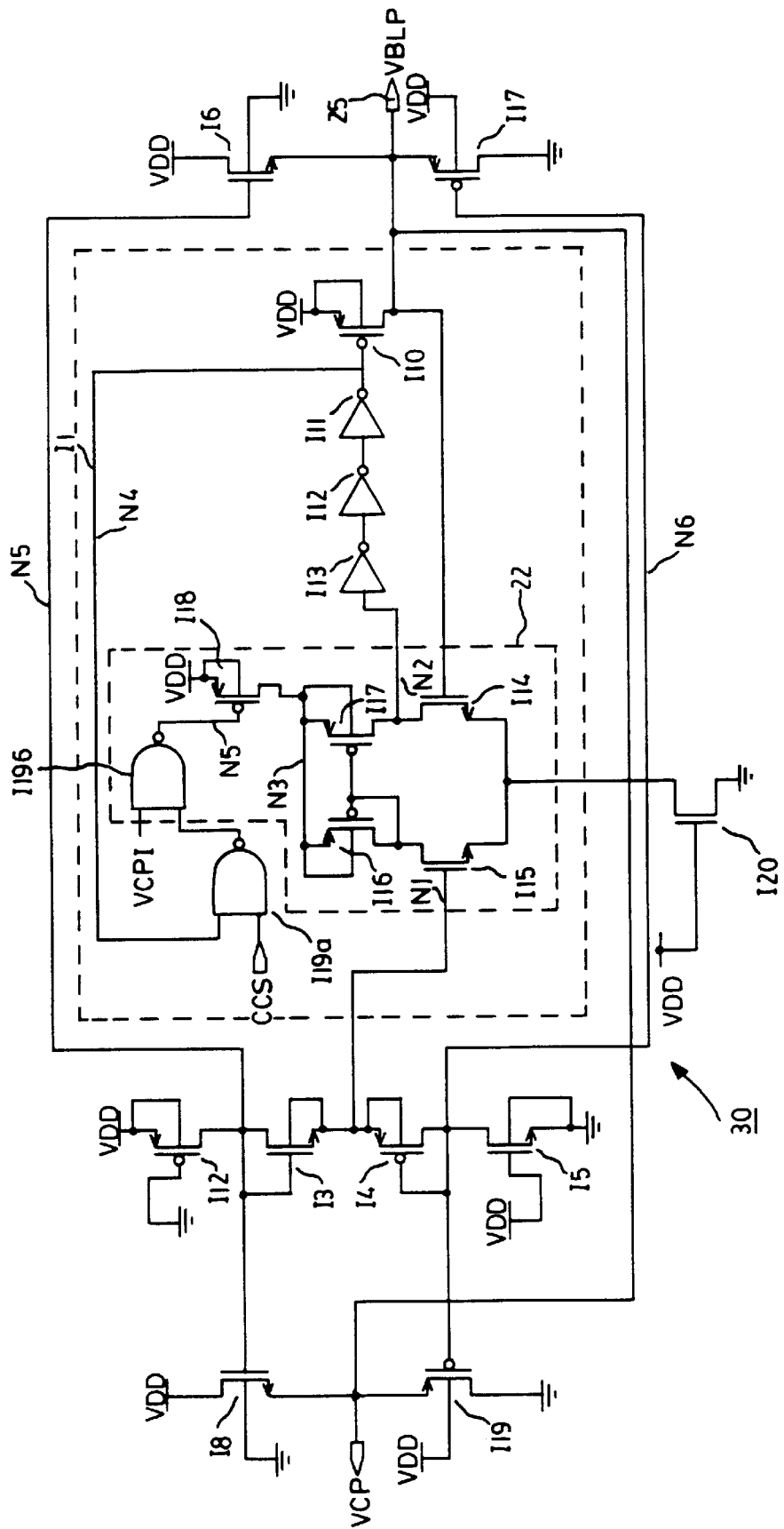
FIGS. 3(b) and (c) are further embodiments of the circuit shown in FIG. 3(a).

Referring to FIG. 3(b), an alternate embodiment to FIG. 3(a) for disabling I1 is shown. In this embodiment, the AND gate I19 is replaced by a pair of two input NAND gate I19a and I19b, respectively. The NAND gate I19a derives its inputs from $N_4$ and CCS as before, however, its output is connected as an input to NAND gate I19b, with the other input being derived from a VCPI ($V_{CP}$ inhibit) signal.

Figure 3C:
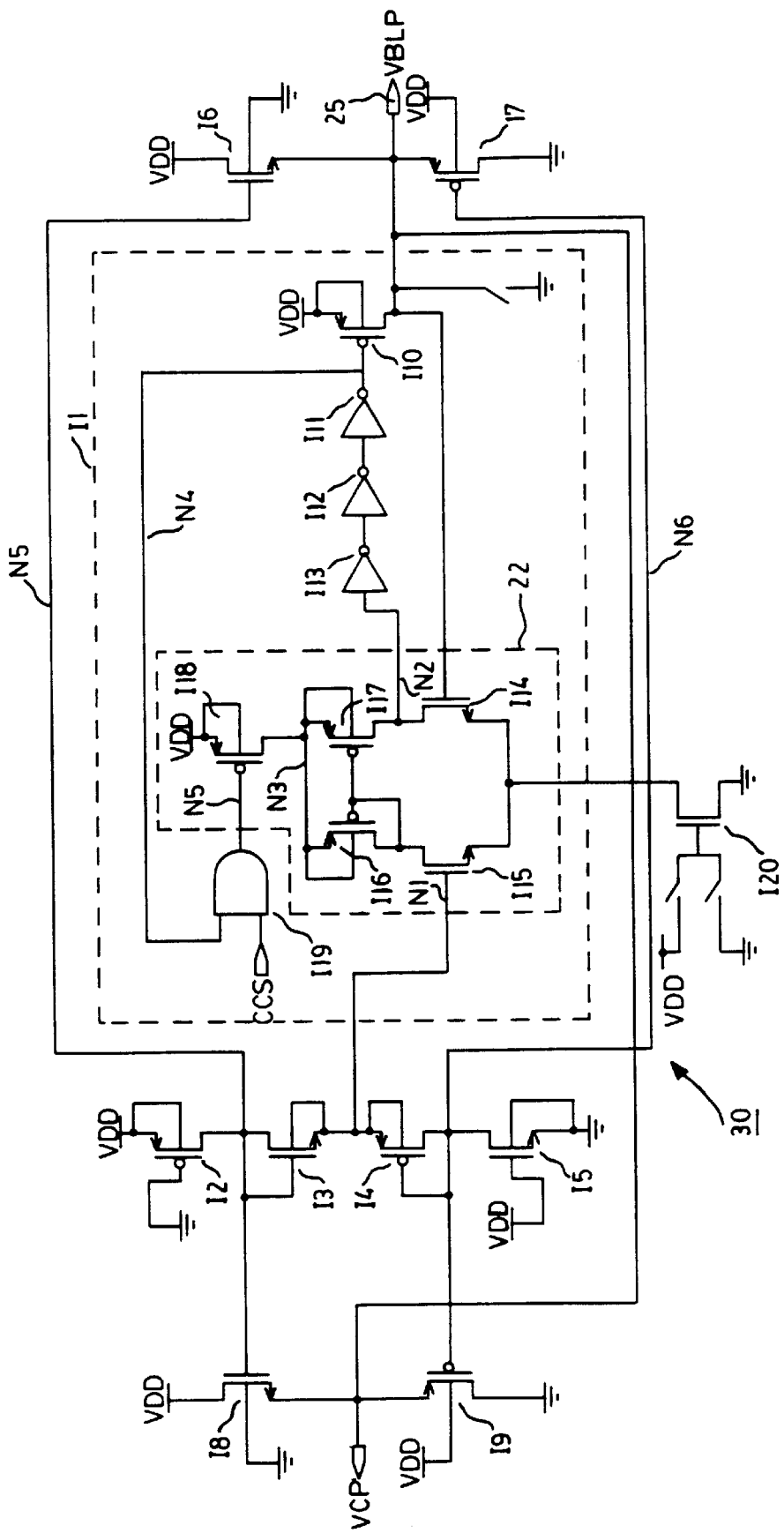

Referring to FIG. 3(c), a still further embodiment to FIG. 3(a) for disabling I1 is shown. In this embodiment, a pair of metal option switches are provided for selectively connecting transistor D20 either to $V_{DD}$ or ground. A further pair of metal option switches may be connected to respective $V_{CP}$ and $V_{BLP}$ lines. These option switches may be selectively used during testing.

While the invention has been described in connection with the specific embodiment thereof, and in a specific use, various modifications thereof will occur to those skilled in the art without departing from the spirit of the invention as set forth in the appended claims. For example, although a single current supply transistor I10 is shown, a plurality of transistors may also be used. The circuit may also be used with circuits having separate voltage drives for $V_{CP}$ and $V_{BLP}$. However, an advantage for having the $V_{CP}$ and the $V_{BCP}$ terminals connected together, as shown in the above embodiments, allows for quick power-up of both the $V_{CP}$ and $V_{BLP}$ lines. The terms and expressions which have been employed in this specification are used as terms of description and not of limitations, there is no intention in the use of such terms and expressions to exclude any equivalence of the features shown and described or portions thereof, but it is recognized that various modifications are possible within the scope of the claims to the invention.

The embodiments of the invention in which an exclusive property or privilege is claimed are defined as follows:

1. A regulator circuit for use with a voltage generator circuit that supplies a cell plate voltage in a semiconductor memory, said regulator circuit comprising:
   (a) a level detector for producing a control signal by continually tracking a relative level between a reference voltage and said cell plate voltage received at respective first and second inputs thereof; and
   (b) a current source operable for coupling a current to said cell plate in response to said control signal, whereby when said cell plate voltage drops below said reference voltage said current source is coupled to said cell plate to stabilize said cell plate voltage supply.

2. A regulator circuit as defined in claim 1, including means for disabling said regulator circuit.

3. A regulator circuit as defined in claim 1, said reference voltage being generated by a voltage divider connected across a supply voltage of said circuit.

4. A regulator circuit as defined in claim 3, said reference voltage being substantially one half said supply voltage.

5. A regulator circuit as defined in claim 3, said voltage divider comprising first and second serially connected transistors.

6. A regulator circuit as defined in claim 2, said means for disabling having a first input for receiving said regulator control signal and being operable in response thereto to disable said level detector circuit upon said cell plate voltage being at said reference voltage level.

7. A regulator circuit as defined in claim 6, said disabling means including a second input for receiving a comparator control signal for disabling said disabling means, said signal being derived from a signal indicative of said semiconductor substrate bias voltage status.

8. A regulator circuit as defined in claim 7, said disabling means comprising an AND gate receiving said regulator control signal and said comparator control signal at inputs thereof and having an output coupled to disable said level detector.

9. A regulator circuit as defined in claim 1, said level detector comprising a differential input stage.

10. A regulator circuit as defined in claim 6, said level detector comprising a differential input stage and said disabling means operable coupled to disable said differential input stage.

11. A regulator circuit as defined in claim 1, said current source comprising a field effect transistor having its source drain circuit coupled between a supply voltage and an output node of said cell plate voltage generator and said regulator control signal coupled to its gate terminal.

12. A method of regulating a cell plate voltage in a semiconductor memory, said method comprising the steps of:
   (a) continuously tracking said cell plate voltage;
   (b) comparing the cell plate voltage to a reference voltage to produce a regulator control signal when the cell plate voltage is below the reference voltage;
   (c) using the control signal to activate a current source for coupling to the cell plate voltage line, to stabilize the cell plate voltage, and decoupling the current source when the cell plate voltage is stabilized.

13. A method as defined in claim 12, said reference voltage being derived from a supply voltage to track long term variations in said supply.

* * * * *